(12) United States Patent
van der Jeugd

(10) Patent No.: US 6,335,280 B1
(45) Date of Patent: Jan. 1, 2002

(54) TUNGSTEN SILICIDE DEPOSITION PROCESS

(75) Inventor: Cornelius Alexander van der Jeugd, Tempe, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 08/783,815

(22) Filed: Jan. 13, 1997

(51) Int. Cl.$^7$ ................................ H01L 21/44
(52) U.S. Cl. .................. 438/674; 438/669; 438/657; 438/680
(58) Field of Search ................ 438/586, 674, 438/680, 935, 669, 657, 737, 742

(56) References Cited

U.S. PATENT DOCUMENTS

| | | | |
|---|---|---|---|
| 4,528,744 A | * | 7/1985 | Shibata |
| 4,629,635 A | | 12/1986 | Brors |
| 4,751,101 A | | 6/1988 | Joshi |

(List continued on next page.)

FOREIGN PATENT DOCUMENTS

| | | | |
|---|---|---|---|
| EP | 0328970 | | 8/1989 |
| EP | 0689231 | | 12/1995 |
| EP | 0689232 | | 12/1995 |
| EP | 0746027 | | 12/1996 |
| JP | 02-114641 | * | 4/1990 |
| JP | 3248574 | * | 11/1991 |
| JP | 7-230957 | * | 8/1995 |
| JP | 7297150 | * | 11/1995 |

OTHER PUBLICATIONS

R. V. Joshi et al "Characteristics of selective SPCVD W films by silicon reduction" Mat. Issues in Si IC Processing Symp. p. 309–14, Apr. 1986.*

Kobayashi, et al. IEEE Trans, Electron Devices, 37 pp 577–582, Mar. 1990.*

M. Hathaway, S. Mehta, T. Trowbridge, and C. S. Lai, *Advanced Metallization for ULSI Applications 1992*; edited by T. S. Cale and F. S. Pintchovsky (MRS, Pittsburgh, PA, 1993), pp. 333–339.

N. Kobayashi, M. Suzuki and M. Saitou, *Tungsten and Other Refractory Metals for VLSI Applications IV*; edited by R. S. Blewer and C. M. McConica (MRS, Pittsburgh, PA, 1989), pp. 143–149.

M. L. Green, Y. S. Ali, T. Boone, B. A. Davidson, L. C. Feldman and S. Nakahara, *Tungsten and Other Refractory Metals for VLSI Applications II*; edited by E. K. Broadbent (MRS, Pittsburgh, PA, 1987), pp. 85–92.

R. H. Wilson, R. W. Stoll and M.A. Calacone, *Tungsten and Other Refractory Metals for VLSI Applications*; edited by R. S. Blewer (MRS, Pittsburgh, PA, 1986), pp. 35–42.

R J. Mianowski, K. Y. Tao and H. A. Waggener, *Tungsten and Other Refractory Metals for VLSI Appilcations*; edited by R. S. Blewer (MRS, Pittsburgh, PA, 1986), pp. 145–158.

M. E. Tracy, *Tungsten and Other Refractory Metals for VLSI Applications*; edited by R. S. Blewer (MRS, Pittsburgh, PA, 1986), pp. 211–219.

(List continued on next page.)

*Primary Examiner*—Caridad Everhart
(74) *Attorney, Agent, or Firm*—Knobbe, Martens, Olson & Bear, LLP

(57) ABSTRACT

A method of forming a gate metallization in a semiconductor integrated circuit by forming a polycrystalline silicon layer over a gate dielectric layer and then converting the polycrystalline silicon layer into tungsten or tungsten silicide by exposing the polycrystalline silicon to tungsten hexafluoride gas. The method enables the formation of polycrystalline silicon and tungsten or tungsten silicide in the same process cycle in the same reactor or in two similarly configured reactors or in two similarly configured clustered reactors.

37 Claims, 5 Drawing Sheets

U.S. PATENT DOCUMENTS

| | | | |
|---|---|---|---|
| 4,851,295 A | | 7/1989 | Brors |
| 4,888,087 A | | 12/1989 | Moslehi et al. |
| 4,913,929 A | | 4/1990 | Moslehi et al. |
| 4,966,869 A | | 10/1990 | Hillman et al. |
| 4,968,644 A | | 11/1990 | Gallagher et al. |
| 4,985,372 A | * | 1/1991 | Narita |
| 5,043,299 A | | 8/1991 | Chang et al. |
| 5,071,788 A | * | 12/1991 | Joshi |
| 5,084,417 A | | 1/1992 | Joshi et al. |
| 5,147,820 A | * | 9/1992 | Chittipeddi et al. |
| 5,173,438 A | | 12/1992 | Sandhu .................. 437/63 |
| 5,212,400 A | | 5/1993 | Joshi |
| 5,231,056 A | | 7/1993 | Sandhu .................. 437/200 |
| 5,322,809 A | | 6/1994 | Moslehi |
| 5,338,398 A | | 8/1994 | Szwejkowski et al. |
| 5,341,016 A | * | 8/1994 | Prall et al. |
| 5,356,835 A | | 10/1994 | Somekh et al. |
| 5,391,394 A | | 2/1995 | Hansen .................. 427/124 |
| 5,434,110 A | * | 7/1995 | Foster et al. |
| 5,482,749 A | | 1/1996 | Telford et al. |
| 5,500,249 A | | 3/1996 | Telford et al. |
| 5,510,297 A | | 4/1996 | Telford et al. |
| 5,558,910 A | | 9/1996 | Telford et al. |
| 5,565,382 A | | 10/1996 | Tseng et al. |
| 5,767,004 A | * | 6/1998 | Balasubramanian et al. ..... 438/592 |
| 5,851,581 A | * | 12/1998 | Zenke .................. 427/97 |

OTHER PUBLICATIONS

John E. J. Schmitz, *Chemical Vapor Deposition of Tungsten and Tungsten Silicides for VLSI/ULSI Applications*; (NP, Park Ridge, New Jersey, 1992).

Y. Nakamura, N. Kobayashi, D. Hisamoto, K. Umesa and R. Nagai, *Jpn. J. Appl. Phys.* vol. 35 (1996) pp. 1082–1085, Part 1, No. 2B, Feb. 1996.

M. M. Moslehi, M. Wong, K. C. Saraswat and S. C. Shatas, *1987 Symposium on VLSI Technology*; (Japan Society of Applied Physics, Tokyo, Japan, 1987), pp. 21–22.

M. Wong, N. Kobayashi, R. Browning, D. Paine, and K.C. Saraswat, *Journal of the Electrochemical Society* vol. 134, No. 9 Sep. 1987.

Wen–Kuan Yeh, Yeu–Cherng Shiau, and Mao–Chieh Chen, *A New Tungsten Gate Metal Oxide Semiconductor Capacitor Using a Chemical Vapor Deposition Process*; J. Electrochem. Soc., vol. 144, No. 1, Jan. 1997 ©The Electrochemical Society, Inc., pp. 214–217.

T. Kaga, Y. Sudoh, H. Goto, K. Shoji, T. Kisu, H. Yamashita, R. nagai, S. Iijima, M. Ohkura, F. Murai, T. Tanaka, Y. Goto, N. Yokoyama, M. Horiguchi, M. Isoda, T. Nishida, E. Takeda, "A 0.29–$\mu m^2$ MIM–CROWN Cell and Process Technologies for 1–Gigabit DRAMs,", IEDM 94, pp. 927–929.

G.J. Leusink, C.R. Kleijn, T.G.M. Oosterlake, G.C.A.M. Janssen, S. Radelaar, "Growth kinetics and inhibition of growth of chemical vapor deposited thin tungsten films on silicon from tungsten hexafluoride," J. Appl. Phys., vol. 7, pp. 490–498.

N. Kobayashi, M. Susuki, M. Saitou, "Tungsten Plug Technology Using Substitution of W for Si, " IEEE trans., Electron Devices, 37 (1990), pp. 577–582 (Mar. 1990).

* cited by examiner

TUNGSTEN SILICIDE DEPOSITION PROCESS

BACKGROUND OF THE INVENTION

1. Field of the Invention

The present invention relates to microelectronic device fabrication, and more particularly, to a method of forming tungsten or tungsten silicide layers for use in gate metallizations and local interconnects in a semiconductor integrated circuit.

2. Description of the Related Technology

In microelectronic devices common in the art, a field effect transistor 10 is formed in a semiconductor 11 by interposing a gate 12 of the transistor between heavily doped regions comprising the source 14 and drain 16 of the transistor as shown in FIG. 1. In older semiconductor devices, the gate 12 comprised doped polycrystalline silicon (poly) over the gate dielectric 20. However, as the dimensions of transistors and their interconnections have decreased into the submicron region, the high resistivity of doped poly adversely impacts the switching speed of field effect transistors 10. Thus, to increase the switching speed of a transistor 10, semiconductor manufacturers use a multi-layer structure 18 including a metallic layer, such as tungsten (W) or tungsten silicide ($WSi_2$), to reduce the resistivity of gates 12 and local interconnect lines so as to increase the operating speed of circuits formed from interconnected transistors. Thus, the gate 12 of a current transistor 10 typically comprises a multilayer structure 18 on top of a thin silicon oxide layer 20 in contact with the silicon semiconductor 11. The multilayer structure 18 comprises a doped poly layer 22 in contact with the silicon oxide layer 20 and a metallic layer 24 comprising W or $WSi_2$ in contact with the poly layer 22.

During the formation of the microelectronic device, a metallic W or $WSi_2$ layer may be deposited either selectively or nonselectively. In U.S. Pat. No. 4,913,929, Moslehi, et al., disclose several selective and nonselective methods for depositing a W layer using a cold wall single wafer thermal/microwave remote plasma multiprocessing reactor. Moreover, as described by Leusink, et al., in *J. Appl. Phys.* 72, 490 (1992), selective deposition of W or $WSi_2$ proceeds by the following well known chemical reactions:

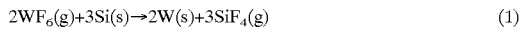
$$2WF_6(g)+3Si(s) \rightarrow 2W(s)+3SiF_4(g) \quad (1)$$

$$WF_6(g)+3Si(s) \rightarrow W(s)+3SiF_2(g) \quad (2)$$

$$W(s)+2Si(s) \rightarrow WSi_2 \quad (3)$$

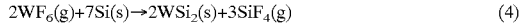
$$2WF_6(g)+7Si(s) \rightarrow 2WSi_2(s)+3SiF_4(g) \quad (4)$$

Reactions 1 and 2 describe the formation of tungsten. After the tungsten has been formed by either reaction 1 or 2, it can react further with the underlying Si to form $WSi_2$ (reaction 3). Reaction 4 describes the direct formation of $WSi_2$. Thus, the basic reaction is the silicon (Si) reduction of tungsten hexafluoride ($WF_6$) gas, a displacement reaction where exposed Si is converted to a solid layer of W thereby releasing the displaced Si in the volatile gases $SiF_2$ and $SiF_4$. In contrast to nonselective or blanket depositions, these reactions cause selective deposition of W because only those Si regions exposed to $WF_6$ on the semiconductor 11 react to form a deposited W layer. There is no conversion to W of regions of the semiconductor 11 having exposed regions comprising materials other than Si, such as silicon oxide ($SiO_2$) or silicon nitride ($Si_3N_4$).

According to reactions (1) and (2), every nanometer of W formed consumes approximately two nanometers of the exposed Si. Thus, as noted by Leusink, et al., the Si reduction of $WF_6$ should be suppressed as the etching of exposed Si, such as source or drain regions, is an undesired result. To prevent or reduce undesired etching of exposed Si regions, combinations of $WF_6$ gas and reducing agents, such as the gases $H_2$, $SiH_4$ or $GeH_4$, have been used for the chemical vapor deposition (CVD) of W. Currently, tungsten CVD by $WF_6/H_2$ or $WF_6/SiH_4$ are the preferred methods used in the microelectronics industry. However, in *IEEE Trans. Electron Devices*, 37, 577 (1990), Kobayashi, et al., describe applying the selective deposition of W to form a W contact (plug) by substitution of undoped poly by W. FIG. 2a illustrates a cross sectional view of a semiconductor wafer prepared for the substitution of undoped poly by W. An oxide layer 32 resides on the silicon substrate 30. A barrier layer 34 comprising titanium nitride (TiN) resides on the silicon oxide layer 32 and within the contact aperture 38, where the TiN barrier layer 34 contacts the silicon substrate 30. Lastly, a conformal poly layer 36 is deposited over the TiN barrier layer 34.

Referring now to FIG. 2b, an etch back of the poly layer 36 is performed to remove poly from the TiN barrier layer 34. Note that the etch back step slightly over etches the poly layer 34 so that the remaining poly 36 is slightly recessed within the aperture 38. Referring now to FIG. 2c, a thin chemical oxide layer 40 is formed over the poly 36 within the aperture 38. This chemical oxide layer 40 enhances the subsequent selective deposition of W. Lastly, substitution of poly 36 by W using $WF_6$ gas occurs to form a W plug 42 as shown in FIG. 2d. Note that the entire volume of poly 36 (FIG. 2c) within the contact aperture 38 is replaced by W so as to form a W plug 42. The TiN barrier layer 34 serves to stop the substitution of Si by W during the selective deposition of a contact. Moreover, this technique is also well adapted to via fills in multilevel metal layer interconnections. However, the TiN barrier layer 34 is not needed in a via fill process as the lower level metal serves to stop the Si substitution by W. Thus, selective deposition of W techniques have found only limited application in contact formation and via fill because of the desire to avoid consumption of exposed Si regions in other device fabrication applications.

Although Moslehi, et al., disclose in U.S. Pat. No. 4,913,929 that several wafer processing steps can be done sequentially in a single reactor, semiconductor manufacturers currently use multiple reactors of significantly different configuration to form and interconnect the many layers needed in a microelectronic device. For example, a manufacturer may use a cluster tool, such as an Applied Materials Centura, having a reactor chamber dedicated to the deposition of poly and also having a reactor chamber of significantly different configuration dedicated to the deposition of $WSi_2$. The present art for tungsten silicide formation uses a gas mixture consisting of tungsten hexafluoride and silane or dichlorosilane. The tungsten silicide deposits according to the following reactions:

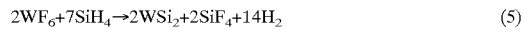
$$2WF_6+7SiH_4 \rightarrow 2WSi_2+2SiF_4+14H_2 \quad (5)$$

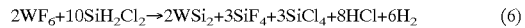
$$2WF_6+10SiH_2Cl_2 \rightarrow 2WSi_2+3SiF_4+3SiCl_4+8HCl+6H_2 \quad (6)$$

The nonselective $WSi_2$ deposition results in deposition of $WSi_2$ on the reactor walls and other areas exposed to the $WF_6$ and $SiH_4$ gas. Thus, this $WSi_2$ reactor chamber requires downtime for frequent etching (cleaning) to remove the $WSi_2$ buildup on exposed areas.

The use of multiple different reactors often results from a strategy to prevent incompatible chemical reactions and materials produced during the formation of a prior layer from impacting the formation of a current or subsequent layer in the same reactor. This strategy is of critical importance to a semiconductor manufacturer as minuscule amounts of impurities in any single layer of a microelectronic device often result in device failures and scrap. At the same time, however, the need for multiple reactors of different configuration creates substantial operational issues in addition to the significant capital funds required to procure multiple different reactors. For example, the manufacturer has to maintain spares for each of the multiple reactor configurations used in its factory at a considerable cost for spares inventory, warehousing and personnel to manage spares.

To improve their operations, microelectronic device manufacturers require fabrication methods and systems that enable them to perform multiple processing steps in reactor chambers of substantially similar configuration. Similarly, manufacturers require fabrication methods and systems that enable them to reduce the amount of cleanroom floorspace needed by fabrication equipment. Manufacturers likewise require fabrication methods and systems that reduce the amount of equipment downtime for cleaning and maintenance. In addition, manufacturers require fabrication methods and systems that reduce the need to manage a substantial number of different spares and consumables inventories for multiple different reactors. Moreover, manufacturers require fabrication methods and systems that facilitate continuous improvement of their fabrication equipment by their equipment vendors. Lastly, manufacturers require fabrication methods and systems that reduce the number of multiple different reactors so as to also reduce the amount of capital finds needed to procure fabrication equipment.

SUMMARY OF THE INVENTION

The present invention enables manufacturers to improve their operations by applying an integrated process to deposit poly or amorphous silicon and tungsten or tungsten silicide for use in the formation of multilayer gate metallizations in semiconductor integrated circuits. In contrast to present methods that produce tungsten or tungsten silicide deposits on reactor walls and other exposed areas, the present invention eliminates the need to use different reactors to form poly, tungsten and tungsten silicide layers in a gate structure and reduces the risk of contamination from reactor deposits and incompatible materials. The present invention likewise reduces equipment downtime for cleaning and maintenance operations associated with deposits on reactor walls and other exposed areas thereby improving equipment throughput. Moreover, the present invention permits a manufacturer to form the poly, tungsten and tungsten silicide layers of a gate structure in the same reactor, in another reactor of substantially similar configuration to the reactor used to form the poly layer or in a reaction chamber of a cluster tool of substantially similar configuration to the reactor chamber used to form the poly layer. Thus, using the present invention, manufacturers can reduce the costs of procuring a variety of different reactors to form these layers. Similarly, manufacturers can reduce the cleanroom floorspace occupied by a variety of different reactors to deposit poly, tungsten and tungsten silicide. In addition, the present invention reduces the associated costs to manage spares inventories related to a variety of different reactors. Lastly, in contrast to structures fabricated using conventional techniques, the present invention produces gate metallization structures with improved adhesion between the tungsten or tungsten silicide layers and the poly layer thereby enabling the reduction of gate dimensions to increase circuit densities.

One aspect of the present invention includes a method of forming a gate in a semiconductor integrated circuit comprising the steps of forming a silicon layer over a gate dielectric layer on a substrate and forming a tungsten layer by converting a portion of said silicon layer to tungsten.

Another aspect of the present invention includes a method of forming a gate in a semiconductor integrated circuit device comprising the steps of forming a silicon layer over a gate dielectric layer on a substrate, forming a tungsten layer by converting a portion of said silicon layer to tungsten and annealing said substrate so as to convert a portion of said tungsten layer to a tungsten silicide layer.

Yet another aspect of the present invention includes a method of forming a gate in a semiconductor integrated circuit device comprising the steps of forming a silicon layer over a gate dielectric layer on a substrate and forming a tungsten silicide layer by converting a portion of said silicon layer to tungsten silicide.

DESCRIPTION OF THE DRAWINGS

FIG. 11 also illustrates the substrate of FIG. 5 after sufficient annealing to convert the tungsten layer to a tungsten silicide layer.

DETAILED DESCRIPTION OF THE PREFERRED EMBODIMENT

Figure 1:
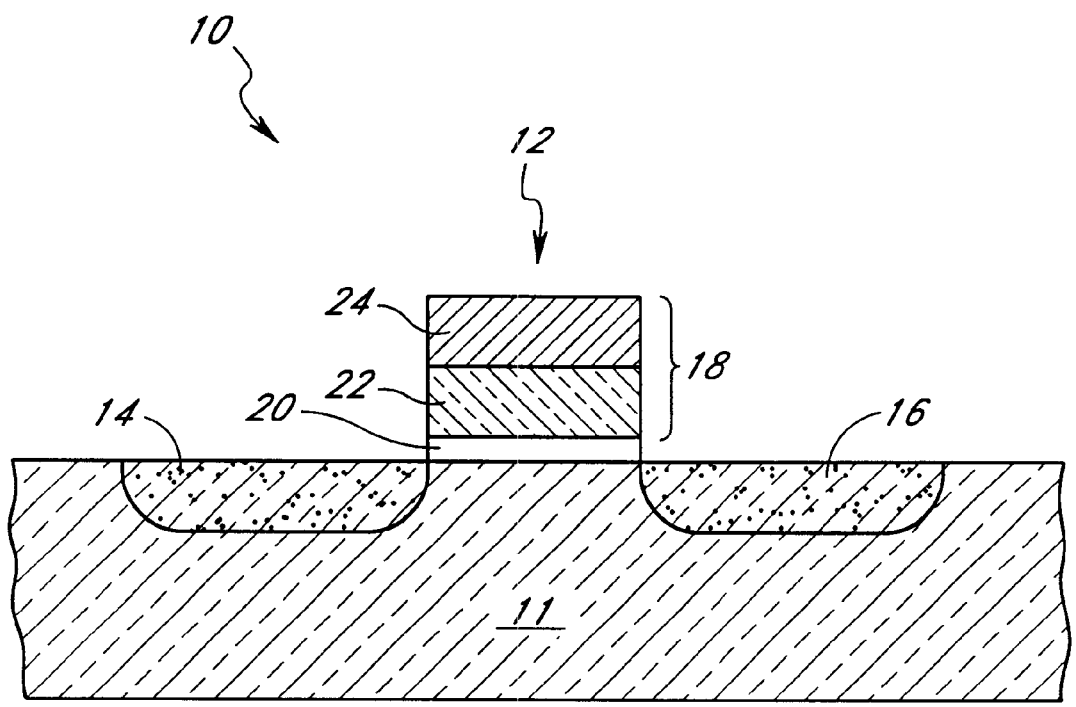
FIG. 1 is a cross sectional illustration of a prior art field effect transistor having a multilayer gate structure.
Figure 2A:
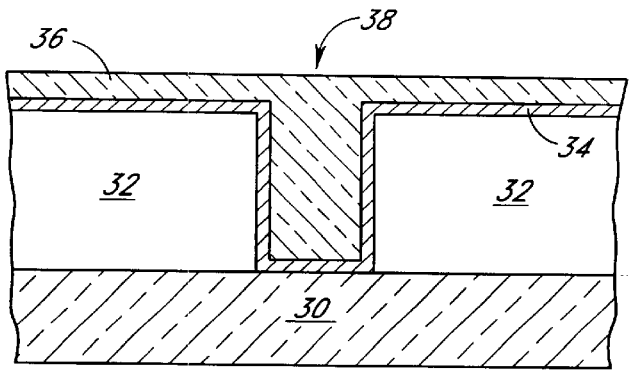
FIG. 2a is a cross sectional illustration of a substrate prepared for the formation of a tungsten contact.
Figure 2B:
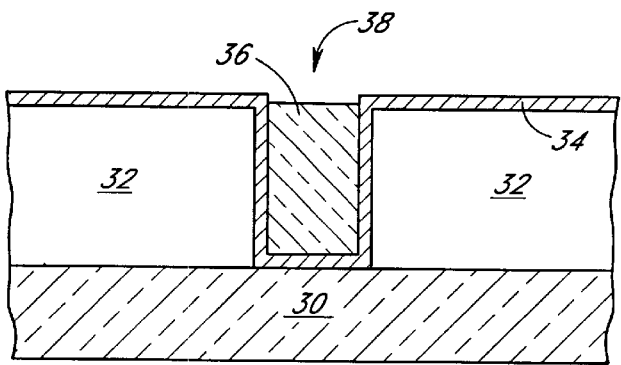
FIG. 2b is a cross sectional illustration of the substrate of FIG. 2a after etchback of the polysilicon layer.
Figure 2C:
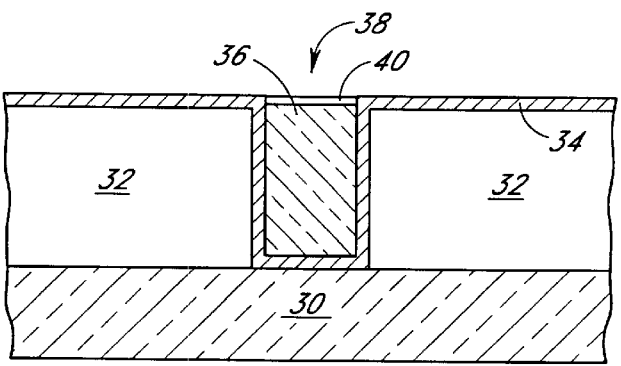
FIG. 2c is a cross sectional illustration of the substrate of FIG. 2b after formation of a chemical oxide layer.
Figure 2D:
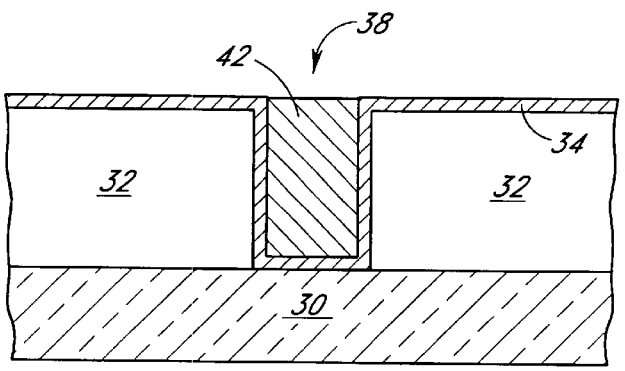
FIG. 2d is a cross sectional illustration of the substrate of FIG. 2c after conversion of tungsten to form a tungsten contact (plug).
Figure 3:
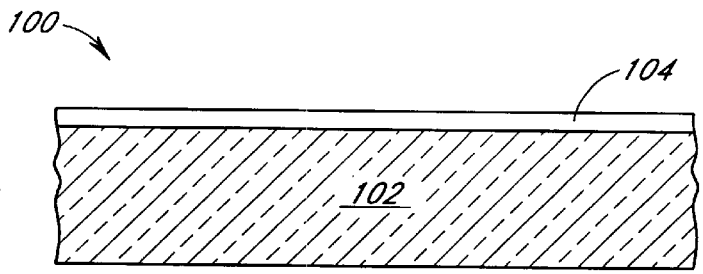
FIG. 3 is a cross sectional illustration of a substrate prepared for the formation of a gate.

Referring now to FIG. 3, a substrate 100 is prepared for the formation of a gate. The term substrate refers to one or more semiconductor layers or structures which include active or operable portions of semiconductor devices. A gate dielectric 104 has been grown over the entire substrate 100 in preparation for formation of transistor gate structures. In a preferred embodiment, the substrate 100 comprises a silicon semiconductor wafer having a lightly doped single crystal silicon top layer 102 wherein the microelectronic circuits are fabricated. The gate dielectric 104 comprises a thin layer of silicon oxide having a thickness of about 10 nanometers.

Figure 4:
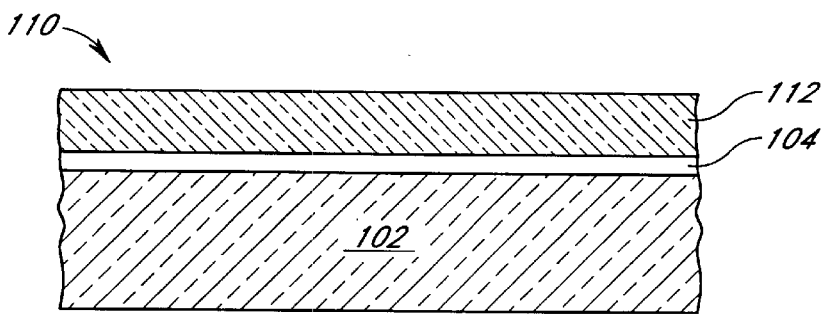
FIG. 4 is a cross sectional illustration of the substrate of FIG. 3 after deposition of a polysilicon layer.

Referring now to FIG. 4, a silicon layer 112 has been deposited over the gate dielectric 104. In a preferred embodiment, a polycrystalline silicon (poly) layer 112 is formed over the gate dielectric 104 by exposing the substrate 110 to silane ($SiH_4$) gas at a temperature in the range of 575° C. to 800° C. and at a pressure in the range of 0.1 torr to 760 torr for a time sufficient to form a thickness in the range of 100 nanometers to 800 nanometers. In another preferred embodiment, a poly layer 112 is formed over the gate dielectric 104 by exposing the substrate 110 to disilane ($Si_2H_6$) gas at a temperature in the range of 575° C. to 800° C. and at a pressure in the range of 0.1 torr to 760 torr for a time sufficient to form a thickness in the range of 100 nanometers to 800 nanometers. Generally, the $SiH_4$ and $Si_2H_6$ flows will be diluted in a $H_2$ or $N_2$ carrier gas. In yet another preferred embodiment, an amorphous silicon (a-Si) layer 112 is formed over the gate dielectric 104 by exposing the substrate 110 to $SiH_4$ or $Si_2H_6$ gas at a temperature in the range of 500° C. to 575° C. and at a pressure in the range of 0.1 torr to 760 torr for a time sufficient to form a thickness in the range of 100 nanometers to 800 nanometers. In the higher temperature range, the a-Si layer formed may include some polycrystalline silicon regions. Note that deposited a-Si layers often have smoother surfaces and better uniformity as compared to deposited poly layers.

Moreover, the silicon layer 112 may be doped in situ during its formation. In a preferred embodiment, dopant gases, such as $AsH_3$, $PH_3$ and $B_2H_6$, are added to the $SiH_4$ or $Si_2H_6$ flow during formation of the poly or a-Si layer. The dopant profiles within the silicon layer 112 may be defined by adjustment of the dopant gas flowrate during formation of the silicon layer 112. For example, if the dopant gas flow is shut off prior to that for the $SiH_4$, the top portion of the silicon layer 112 will be undoped while the bottom portion is doped. Similarly, if the dopant gas flow is increased towards the end of the deposition process, the top portion of the silicon layer 112 will be more heavily doped than the bottom portion. The ability to fabricate a silicon layer 112 having a tailored dopant concentration profile facilitates subsequent device processing.

Figure 5:
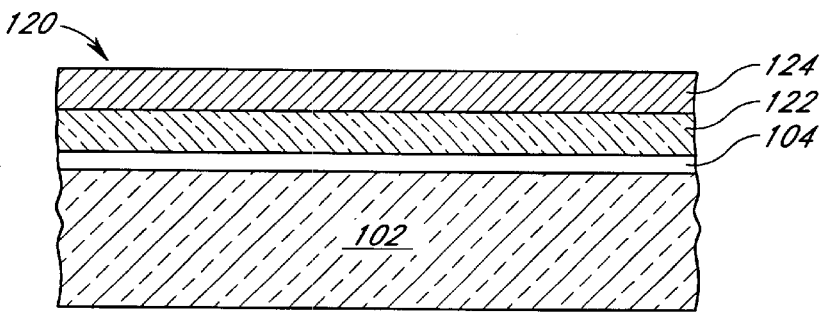
FIG. 5 is a cross sectional illustration of the substrate of FIG. 4 after forming a tungsten layer by conversion of a portion of the polysilicon layer to tungsten.
Figure 6:
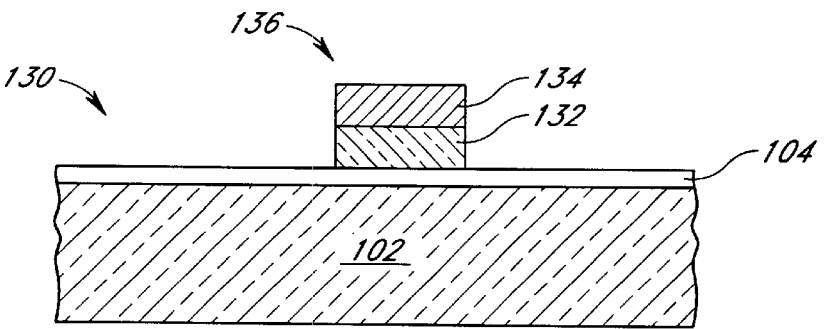
FIG. 6 is a cross sectional illustration of the substrate of FIG. 5 after removing selected portions of the tungsten and polysilicon layers so as to define a gate.

After depositing the poly layer 112, a tungsten layer is formed from a portion of the poly layer 112 using the displacement reaction. Referring now to FIG. 5, in a preferred embodiment, formation of a tungsten layer 124 proceeds by exposing the poly layer 112 (FIG. 4) of the substrate 110 (FIG. 4) to tungsten hexafluoride ($WF_6$) gas at a temperature in the range of 300° C. to 400° C. and at a pressure in the range of 0.1 to 760 torr. Generally, the $WF_6$ will be diluted in a carrier gas, such as argon (Ar) or nitrogen ($N_2$). Note that any gas may be selected as a carrier gas so long as the carrier gas does not react with $WF_6$ to deposit W on top of the poly layer 112 instead of converting a portion of the poly layer 112 to form a tungsten layer 124. Under these conditions, a tungsten layer 124 of a selected self-limiting thickness is formed over the poly layer 122. Self-limiting refers to a condition where the growth of the tungsten layer 124 stops after a certain time, even though sufficient quantities of $WF_6$ are still available for reaction with Si. For example, at a temperature of 370° C., a total pressure of 0.5 torr, a $WF_6$ flow of 50 sccm and an Ar flow of 2000 sccm, a self-limiting tungsten film of about 20 nm is formed in approximately 10 seconds. Note that the growth of the tungsten layer 124 is maintained by Si diffusion from the poly layer 122 until the reaction abruptly stops due to the self-limiting effect. At temperatures above about 300° C., the reaction rate is determined by the $WF_6$ gas diffusion through a boundary layer that forms above the top surface of the tungsten layer 124 in the gas phase. Thus, the growth rate of the tungsten layer 124 is proportional to the $WF_6$ pressure and inversely proportional to the total pressure. The self-limiting effect occurs when the reaction rate becomes limited by the supply of Si atoms from the poly layer 122 to the top surface of the tungsten layer 124. At this moment, the fast diffusion paths for Si are blocked rapidly and the growth stops. As the diffusion of Si to the top surface of the tungsten layer 124 is thermally activated, the thickness of the tungsten layer 124 can be engineered by selecting the proper temperature, $WF_6$ and total pressure. In another preferred embodiment, the formation of a tungsten layer 124 occurs in the same reactor used to form the poly layer 112 (FIG. 4). In yet another preferred embodiment, the formation of a tungsten layer 124 occurs in another reactor of substantially similar configuration to the reactor used to form the poly layer 112 (FIG. 4). In yet another preferred embodiment, formation of a tungsten layer 124 occurs in a reaction chamber of a cluster tool of substantially similar configuration to the reactor chamber used to form the poly layer 112 (FIG. 4). A multilayer gate structure 136 is subsequently defined by removing selected portions of the poly layer 122 and the tungsten layer 124 as shown in FIG. 6. Note that the gate 136 includes a tungsten layer 134 over a poly layer 132.

Figure 7:
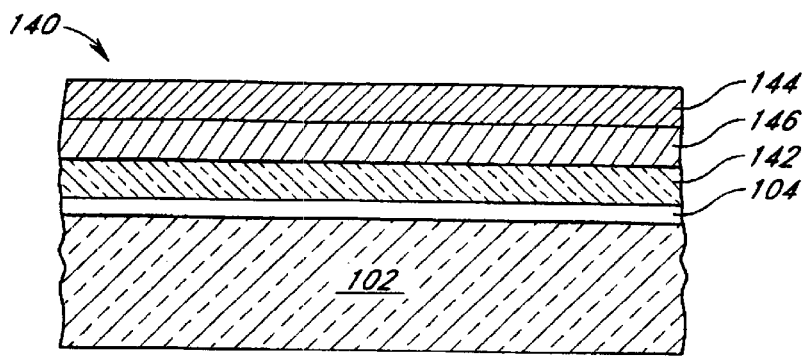
FIG. 7 is a cross sectional illustration of the substrate of FIG. 5 after sufficient annealing to convert a portion of the tungsten layer to a tungsten silicide layer.
Figure 8:
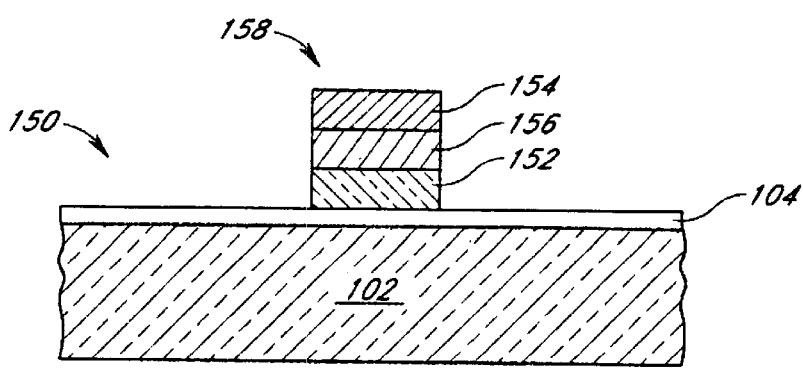
FIG. 8 is a cross sectional illustration of the substrate of FIG. 7 after removing selected portions of the tungsten, tungsten silicide and polysilicon layers so as to define a gate.

Once a tungsten layer 124 (FIG. 5) has been formed from a portion of the poly layer 112 (FIG. 4), a tungsten silicide layer may be formed by conversion of a portion of the remaining poly layer 112. Referring now to FIG. 7, in a preferred embodiment, a portion of the tungsten layer 124 (FIG. 5) has been converted to a tungsten silicide layer 146 by annealing the substrate 120 (FIG. 5) under an inert atmosphere, such as Argon, at a temperature in the range of 600° C. to 1000° C. to form a tungsten silicide layer 146. In another preferred embodiment, the substrate 120 (FIG. 5) is annealed in the same reactor used to form the poly layer 112 (FIG. 4) and to form the tungsten layer 124 (FIG. 5). In yet another preferred embodiment, the substrate 120 (FIG. 5) is annealed in another reactor of substantially similar configuration to the reactor used to form the poly layer 112 (FIG. 4) and to form the tungsten layer 124 (FIG. 5). In yet another preferred embodiment, the substrate 120 (FIG. 5) is annealed in a reaction chamber of a cluster tool of substantially similar configuration to the reactor chamber used to form the poly layer 112 (FIG. 4) and to form the tungsten layer 124 (FIG. 5). A multilayer gate structure 158 is subsequently defined by removing selected portions of the poly layer 142, the tungsten silicide layer 146 and the tungsten layer 144 as shown in FIG. 8. Note that the gate 158 includes a tungsten layer 154 over a tungsten silicide layer 156 over a poly layer 152.

Figure 9:
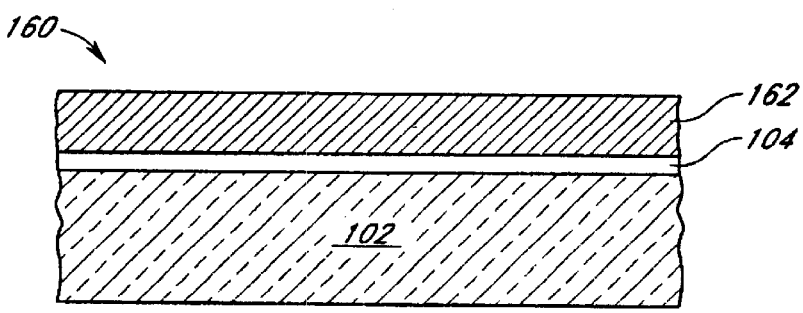
FIG. 9 is a cross sectional illustration of the substrate of FIG. 4 after forming a tungsten layer by conversion of the polysilicon layer to tungsten.
Figure 10:
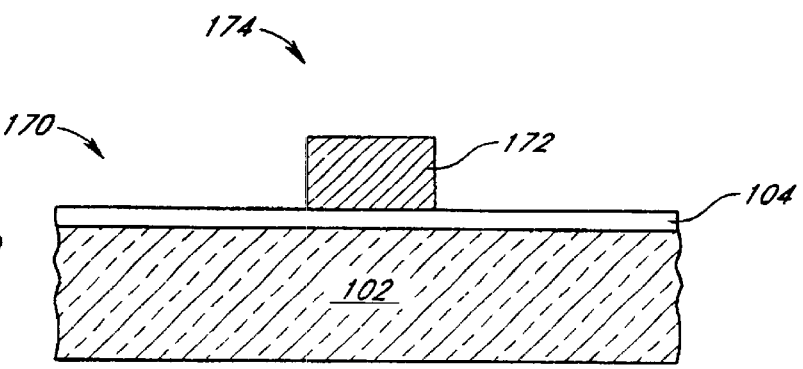
FIG. 10 is a cross sectional illustration of the substrate of FIG. 9 after removing selected portions of the tungsten layer so as to define a gate.

Referring now to FIG. 9, the entire poly layer 112 (FIG. 4) is converted into a tungsten layer 162 by using either a higher total pressure, a lower $WF_6$ partial pressure or a higher temperature. Under these conditions, all of the poly layer 112 is consumed before the self-limiting thickness is reached. In a preferred embodiment, formation of a tungsten layer 162 proceeds by exposing the poly layer 112 (FIG. 4) of the substrate 110 (FIG. 4) to tungsten hexafluoride ($WF_6$) gas at a temperature in the range of 300° C. to 400° C. and at a total pressure in the range of 0.1 to 760 torr for a time sufficient to convert the entire poly layer 112 (FIG. 4) to tungsten. For example, at a temperature of 370° C., a total pressure of 4.0 torr, a $WF_6$ flow of 50 sccm and an Ar flow of 2000 sccm, a 300 nm poly layer is entirely consumed to form a tungsten film of about 150 nm thickness in approximately 160 seconds. As noted above, there is no self-limiting effect here because the entire poly layer 112 (FIG. 4) is already consumed before the self-limiting thickness is reached. For example, at a temperature of 400° C., a total pressure of 0.5 torr, a $WF_6$ flow of 25 sccm and an Ar flow of 2000 sccm, a 300 nm poly layer is entirely consumed to form a tungsten film of about 150 nm thickness in approximately 180 seconds. In yet another preferred embodiment, formation of a tungsten layer 162 proceeds by exposing the poly layer 112 (FIG. 4) of the substrate 110 (FIG. 4) to tungsten hexafluoride ($WF_6$) gas at a temperature in the range of 300° C. to 400° C. and at a $WF_6$ partial pressure in the range of 0.0025 torr to 76 torr for a time sufficient convert the entire poly layer 112 (FIG. 4) to tungsten. For example, at a temperature of 370° C., a total pressure of 0.5 torr, a $WF_6$ flow of 12.5 sccm and an Ar flow of 2000 sccm, a 300 nm poly layer is entirely consumed to form a tungsten film of about 150 nm thickness in approximately 160 seconds. In yet another preferred embodiment, formation of a tungsten layer 162 occurs in the same reactor used to form the poly layer 112 (FIG. 4). In yet another preferred embodiment, formation of a tungsten layer 162 occurs in another reactor of substantially similar configuration to the reactor used to form the poly layer 112 (FIG. 4). In yet another preferred embodiment, formation of a tungsten layer 162 occurs in a reaction chamber of a cluster tool of substantially similar configuration to the reactor chamber used to form the poly layer 112 (FIG. 4). A tungsten gate structure 174 is subsequently defined by removing selected portions of the tungsten layer 162 as shown in the substrate 170 in FIG. 10.

Figure 11:
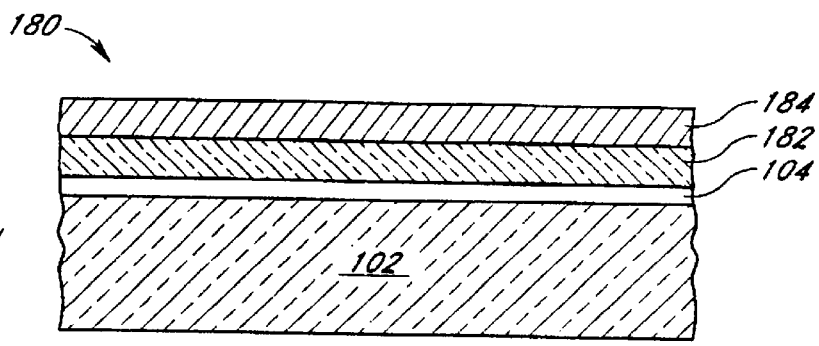
FIG. 11 is a cross sectional illustration of the substrate of FIG. 4 after forming a tungsten silicide layer by conversion of a portion of the polysilicon layer to tungsten silicide.

Moreover, a tungsten silicide layer may also be formed from a portion of the poly layer 112 (FIG. 4). Referring now to FIG. 11, in a preferred embodiment, formation of a tungsten silicide layer 184 proceeds by exposing the poly layer 112 (FIG. 4) of the substrate 110 (FIG. 4) to tungsten hexafluoride ($WF_6$) gas at temperatures generally above 450° C. and at a pressure in the range of 0.1 to 760 torr. Under these conditions, the self limiting effect does not occur. Thus, to form a tungsten silicide layer 184 of a predetermined thickness over the poly layer 182, the $WF_6$ flow must be terminated. For example, at a temperature of 500° C., a total pressure of 0.5 torr, a $WF_6$ flow of 10 sccm and an Ar flow of 2000 sccm, a $WSi_2$ layer of 145 nm thickness is formed when the $WF_6$ flow is terminated in approximately 50 seconds. Note that the tungsten silicide layer 184 formed may be in the metastable hexagonal high resistivity phase. To reduce the resistivity, the substrate 180 is annealed under an inert atmosphere, such as Argon, at a temperature in the range of 600° C. to 1000° C. for a time sufficient to convert the entire hexagonal tungsten silicide phase to the lower resistivity tetragonal tungsten silicide phase. In another preferred embodiment, formation of a tungsten silicide layer 184 occurs in the same reactor used to form the poly layer 112 (FIG. 4). In yet another preferred embodiment, formation of a tungsten silicide layer 184 occurs in another reactor of substantially similar configuration to the reactor used to form the poly layer 112 (FIG. 4). In yet another preferred embodiment, formation of a tungsten silicide layer 184 occurs in a reaction chamber of a cluster tool of substantially similar configuration to the reactor chamber used to form the poly layer 112 (FIG. 4).

Figure 12:
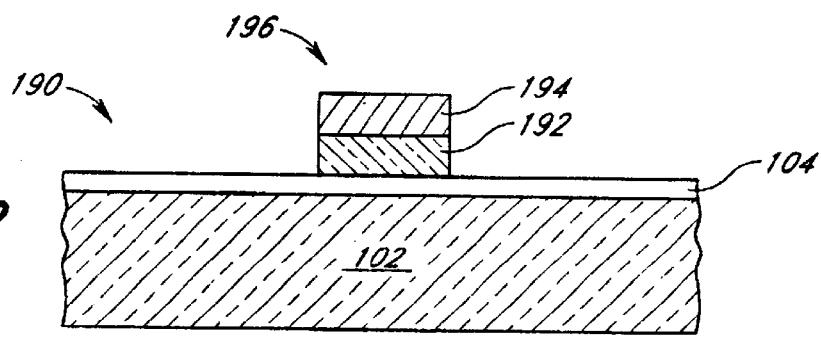
FIG. 12 is a cross sectional illustration of the substrate of FIG. 11 after removing selected portions of the tungsten silicide and polysilicon layers so as to define a gate.

FIG. 11 also illustrates the substrate 120 (FIG. 5) after sufficient annealing to convert the tungsten layer 124 (FIG. 5) and a portion of the poly layer 122 (FIG. 5) to a tungsten silicide layer 184. In a preferred embodiment, the substrate 120 (FIG. 5) having a tungsten layer 124 over a poly layer 122 (FIG. 5) is annealed under an inert atmosphere, such as Argon, at a temperature in the range of 600° C. to 1000° C. for a time sufficient to convert the entire tungsten layer 124 (FIG. 5) to tungsten silicide 184. In another preferred embodiment, the substrate 120 (FIG. 5) is annealed in the same reactor used to form the poly layer 112 (FIG. 4) and to form the tungsten layer 124 (FIG. 5). In yet another preferred embodiment, the substrate 120 (FIG. 5) is annealed in another reactor of substantially similar configuration to the reactor used to form the poly layer 112 (FIG. 4) and to form the tungsten layer 124 (FIG. 5). In yet another preferred embodiment, the substrate 120 (FIG. 5) is annealed in a reaction chamber of a cluster tool of substantially similar configuration to the reactor chamber used to form the poly layer 112 (FIG. 4) and to form the tungsten layer 124 (FIG. 5). A multilayer gate structure 196 is subsequently defined by removing selected portions of the poly layer 182 and the tungsten silicide layer 184 as shown in the substrate 190 in FIG. 12. Note that the gate 196 includes a tungsten silicide layer 194 over a poly layer 192.

Figure 13:
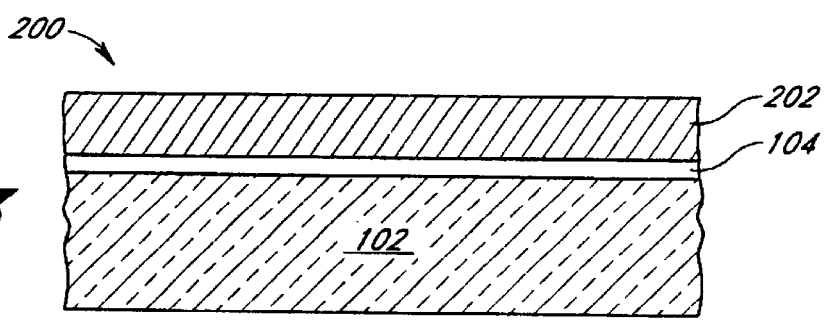
FIG. 13 is a cross sectional illustration of the substrate of FIG. 4 after forming a tungsten silicide layer by conversion of the polysilicon layer to tungsten silicide.
Figure 14:
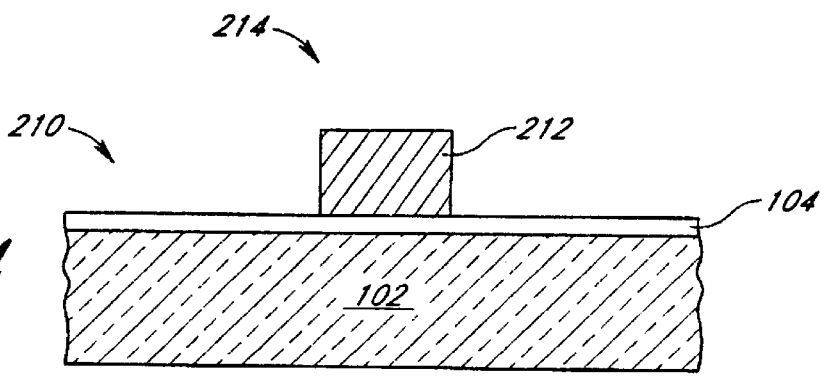
FIG. 14 is a cross sectional illustration of the substrate of FIG. 13 after removing selected portions of the tungsten silicide layer so as to define a gate.

Referring now to FIG. 13, the entire poly layer 112 (FIG. 4) is converted into a tungsten silicide layer 202. In a preferred embodiment, formation of a tungsten silicide layer 202 proceeds by exposing the poly layer 112 (FIG. 4) of the substrate 110 (FIG. 4) to tungsten hexafluoride ($WF_6$) gas at temperatures generally above 450° C. and at a pressure in the range of 0.1 to 760 torr until the entire poly layer 112 (FIG. 4) has been consumed. For example, at a temperature of 500° C., a total pressure of 0.5 torr, a $WF_6$ flow of 10 sccm and an Ar flow of 2000 sccm, a 450 nm poly layer is entirely consumed to form a tungsten silicide film of about 250 nm thickness in approximately 250 seconds. Note that the tungsten silicide layer 202 formed may be in the metastable hexagonal high resistivity phase. To reduce the resistivity, the substrate 180 is annealed under an inert atmosphere, such as Argon, at a temperature in the range of 600° C. to 1000° C. for a time sufficient to convert the entire hexagonal tungsten silicide phase to the lower resistivity tetragonal tungsten silicide phase. In another preferred embodiment, formation of a tungsten silicide layer 202 occurs in the same reactor used to form the poly layer 112 (FIG. 4). In yet another preferred embodiment, formation of a tungsten silicide layer 202 occurs in another reactor of substantially similar configuration to the reactor used to form the poly layer 112 (FIG. 4). In yet another preferred embodiment, formation of a tungsten silicide layer 202 occurs in a reaction chamber of a cluster tool of substantially similar configuration to the reactor chamber used to form the poly layer 112 (FIG. 4). A tungsten silicide gate structure 214 is subsequently defined by removing selected portions of the tungsten silicide layer 202 to leave a patterned tungsten silicide layer 212 as shown in FIG. 14.

The present invention advantageously overcomes several limitations of existing technologies and alternatives. In contrast to conventional deposition processes where a reducing agent, such as $H_2$ or $SiH_4$ is added to the $WF_6$ flow, the $WF_6$ Si conversion reaction produces no deposits or coatings on the reactor walls. Thus, a semiconductor device manufacturer using the present invention to form gate metallizations avoids contamination from reactor coatings and deposits. At the same time, the manufacturer can improve the throughput of its reactors by avoiding frequent reactor cleans required for present deposition methods. In addition, use of the present invention to form a multilayer gate structure produces improved adhesion between the tungsten or tungsten silicide layers and the poly layer as compared to the adhesion of a traditionally deposited tungsten silicide layer on the poly layer, which exhibit cracking followed by delamination with narrower gate dimensions.

Moreover, the present invention eliminates the need to use different reactors to form the poly layer and the tungsten or tungsten silicide layer. Thus, a manufacturer can form a poly layer followed by a tungsten or tungsten silicide layer in the same reactor, in another reactor of substantially similar configuration to the reactor used to form the poly layer or in a reaction chamber of a cluster tool of substantially similar configuration to the reactor chamber used to form the poly layer. This flexibility allows the manufacturer to save costs related to the procurement, installation, use and maintenance of multiple different reactors. In using the present invention, a manufacturer thus realizes certain economies of scale as reactors share the same parts, require the same maintenance and the same training to operate. Lastly, because of the high selectivity of $WF_6$ reduction by Si, a manufacturer may practice the present invention in multiple wafer reactors. Thus, the present invention enables the metallization of a full batch of poly deposited wafers at once with tungsten or tungsten silicide.

Those skilled in the art may practice the principles of the present invention in other specific forms without departing from its spirit or essential characteristics. Accordingly, the disclosed embodiments of the invention are merely illustrative and do not serve to limit the scope of the invention set forth in the following claims.

What is claimed is:

1. A method of forming a gate electrode in a semiconductor integrated circuit device, comprising the steps of:

forming a silicon layer over a gate dielectric layer on a substrate;

forming a tungsten layer by replacing silicon atoms in the silicon layer with tungsten atoms by a displacement reaction prior to patterning the gate electrode; and annealing said substrate so as to react a substantial portion of said tungsten layer with underlying silicon to form a tungsten silicide layer.

2. The method of claim 1, further comprising the step of removing selected portions of said silicon layer, said tungsten layer and said tungsten silicide layer after annealing said substrate so as to form the gate electrode.

3. The method of claim 1, wherein the step of forming a silicon layer comprises exposing the substrate to a selected flowrate of silane gas at a selected temperature and at a selected pressure.

4. The method of claim 1, wherein the step of forming a silicon layer comprises exposing the substrate to selected flowrates of silane gas and a dopant gas at a selected temperature and at a selected pressure so as to form a doped silicon layer.

5. The method of claim 1, wherein the step of forming a silicon layer comprises exposing the substrate to a selected flowrate of disilane gas at a selected temperature and at a selected pressure.

6. The method of claim 1, wherein the step of forming a silicon layer comprises exposing the substrate to selected flowrates of disilane gas and a dopant gas at a selected temperature and at a selected pressure so as to form a doped silicon layer.

7. The method of claim 1, wherein said silicon layer comprises polycrystalline silicon.

8. The method of claim 1, wherein said silicon layer comprises amorphous silicon.

9. The method of claim 1, wherein the step of forming a tungsten layer comprises exposing said silicon layer to a selected flowrate of tungsten hexafluoride gas at a temperature and a pressure selected to effect the displacement reaction.

10. The method of claim 9, wherein the step of forming a tungsten layer forms a tungsten layer of a selected self-limiting thickness.

11. The method of claim 1, wherein said portion of said silicon layer comprises the entire silicon layer.

12. The method of claim 1, wherein the step of annealing said substrate comprises heating said substrate at a selected temperature in an inert atmosphere.

13. The method of claim 1, wherein the steps of forming a silicon layer, forming a tungsten layer and annealing said substrate occur in the same reactor.

14. The method of claim 1, wherein the steps of forming a silicon layer, forming a tungsten layer and annealing said substrate occur in a plurality of reactors of substantially similar configuration.

15. The method of claim 14, wherein said plurality of reactors comprise a cluster tool.

16. The method of claim 1, wherein said substantial portion of said tungsten layer comprises the entire tungsten layer.

17. A method of forming a gate electrode in a semiconductor integrated circuit device, comprising the steps of:

forming a silicon layer over a gate dielectric layer on a substrate;

forming a tungsten silicide layer by replacing silicon atoms in the silicon layer with tungsten and silicon atoms by a displacement reaction prior to patterning the gate electrode, and patterning said silicon and tungsten silicide layers to form the gate electrode.

18. The method of claim 17, wherein patterning comprises a photolithographic and etch process.

19. The method of claim 17, further comprising the step of annealing substrate so as to reduce the resistivity of said tungsten silicide layer.

20. The method of claim 19, further comprising the step of removing selected portions of said silicon layer and said tungsten silicide layer so as to form the gate.

21. The method of claim 17, wherein the step of forming a silicon layer comprises exposing the substrate to a selected flowrate of silane gas at a selected temperature and at a selected pressure.

22. The method of claim 17, wherein the step of forming a silicon layer comprises exposing the substrate to selected flowrates of silane gas and a dopant gas at a selected temperature and at a selected pressure so as to form a doped silicon layer.

23. The method of claim 17, wherein the step of forming a silicon layer comprises exposing the substrate to a selected flowrate of disilane gas at a selected temperature and at a selected pressure.

24. The method of claim 17, wherein the step of forming a silicon layer comprises exposing the substrate to selected flowrates of disilane gas and a dopant gas at a selected temperature and at a selected pressure so as to form a doped silicon layer.

25. The method of claim 17, wherein said silicon layer comprises polycrystalline silicon.

26. The method of claim 17, wherein said silicon layer comprises amorphous silicon.

27. The method of claim 17, wherein the step of forming a tungsten silicide layer comprises exposing said silicon layer to a selected flowrate of tungsten hexafluoride gas at a temperature and a pressure selected to effect the displacement reaction.

28. The method of claim 17, wherein said portion of said silicon layer comprises the entire silicon layer.

29. The method of claim 17, wherein the steps of forming a silicon layer and forming a tungsten silicide layer occur in the same reactor.

30. The method of claim 17, wherein the steps of forming a silicon layer and forming a tungsten silicide layer occur in a plurality of reactors of substantially similar configuration.

31. The method of claim 30, wherein said plurality of reactors comprise a cluster tool.

32. A process of forming a gate electrode on a semiconductor substrate, comprising:
   depositing a silicon layer on a substrate in a reactor chamber; and
   replacing at least a portion of silicon atoms in the silicon layer with atoms to form a metallic layer comprising tungsten by direct substitution within the same reactor chamber, wherein the metallic layer comprises tungsten silicide.

33. The process of claim 32, further comprising patterning the silicon layer and metallic layer to define the gate electrode.

34. A method of forming a gate stack over a semiconductor substrate, comprising:
   forming a gate dielectric layer on the semiconductor substrate;
   depositing a silicon layer directly over the gate dielectric layer with the substrate positioned in a chemical vapor deposition chamber;
   selectively depositing a tungsten layer on the silicon layer with the substrate positioned in a chamber of substantially the same configuration;
   annealing to react the tungsten layer with underlying silicon to form a tungsten silicide layer; and
   patterning the gate stack after selectively depositing.

35. The method of claim 34, wherein depositing the polysilicon layer and selectively depositing the tungsten layer are conducted in the same chamber.

36. The method of claim 34, wherein depositing the polysilicon layer and selectively depositing the tungsten layer are conducted in different chambers within a cluster tool.

37. A process of forming a gate electrode on a semiconductor substrate, comprising:
   depositing a silicon layer on a substrate in a reactor chamber;
   replacing at least a substantial portion of the silicon atoms in the silicon layer with tungsten atoms by direct substitution prior to patterning the gate electrode;
   annealing the silicon and elemental tungsten layers to form a tungsten silicide layer.

* * * * *